(12) United States Patent
Lim et al.

(10) Patent No.: US 9,755,067 B2
(45) Date of Patent: Sep. 5, 2017

(54) SEMICONDUCTOR DEVICE AND FABRICATION METHOD THEREOF

(71) Applicant: MAGNACHIP SEMICONDUCTOR, LTD., Cheongju-si (KR)

(72) Inventors: Min Gyu Lim, Cheongju-si (KR); Jung Hwan Lee, Cheongwon-gun (KR); Yi Sun Chung, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/008,218

(22) Filed: Jan. 27, 2016

(65) Prior Publication Data
US 2016/0141415 A1    May 19, 2016

Related U.S. Application Data

(62) Division of application No. 13/875,418, filed on May 2, 2013, now Pat. No. 9,281,395.

(30) Foreign Application Priority Data

Aug. 6, 2012    (KR) .................. 10-2012-0085905

(51) Int. Cl.
| | |
|---|---|
| *H01L 29/76* | (2006.01) |
| *H01L 29/78* | (2006.01) |
| *H01L 29/66* | (2006.01) |
| *H01L 27/092* | (2006.01) |
| *H01L 29/423* | (2006.01) |
| *H01L 29/06* | (2006.01) |

(Continued)

(52) U.S. Cl.
CPC ........ *H01L 29/7816* (2013.01); *H01L 27/092* (2013.01); *H01L 29/0653* (2013.01); *H01L 29/1083* (2013.01); *H01L 29/1095* (2013.01); *H01L 29/42368* (2013.01); *H01L 29/66659* (2013.01); *H01L 29/66681* (2013.01); *H01L 29/7817* (2013.01); *H01L 29/7835* (2013.01); *H01L 29/0847* (2013.01)

(58) Field of Classification Search
CPC ............. H01L 29/0847; H01L 27/0924; H01L 29/66795; H01L 29/0649; H01L 29/66545
USPC ........................................................ 257/338
See application file for complete search history.

(56) References Cited

U.S. PATENT DOCUMENTS

| | | | |
|---|---|---|---|
| 7,683,427 B2 | 3/2010 | Chen et al. | |
| 7,977,715 B2 * | 7/2011 | Cai ................. | H01L 21/823412 257/288 |

(Continued)

OTHER PUBLICATIONS

Chinese Office Action dated Feb. 16, 2017 in counterpart Chinese Patent Application No. 201310218332.2 (32 pages, in Chinese with English translation).

*Primary Examiner* — Andy Huynh
(74) *Attorney, Agent, or Firm* — NSIP Law

(57) ABSTRACT

A semiconductor device and a fabrication method thereof are provided. The semiconductor device includes a P type well region and an N type well region formed in a substrate, a gate insulating layer having a non-uniform thickness and formed on the P type well region and the N type well region, a gate electrode formed on the gate insulating layer, a P type well pick-up region formed in the P type well region, and a field relief oxide layer formed in the N type well region between the gate electrode and the drain region.

18 Claims, 8 Drawing Sheets

(51) Int. Cl.
*H01L 29/10* (2006.01)
*H01L 29/08* (2006.01)

(56) References Cited

U.S. PATENT DOCUMENTS

| | | | |
|---|---|---|---|
| 2002/0175366 A1* | 11/2002 | Lotfi | ................... H01L 27/0922 |
| | | | 257/335 |
| 2003/0141559 A1 | 7/2003 | Moscatelli et al. | |
| 2006/0008962 A1 | 1/2006 | Ozeki et al. | |
| 2007/0207600 A1 | 9/2007 | You et al. | |
| 2010/0032756 A1 | 2/2010 | Pendharkar et al. | |
| 2011/0204425 A1 | 8/2011 | Lee et al. | |
| 2011/0244644 A1* | 10/2011 | Zuniga | ............ H01L 21/823418 |
| | | | 438/286 |
| 2012/0007179 A1 | 1/2012 | Pang et al. | |

* cited by examiner

SEMICONDUCTOR DEVICE AND FABRICATION METHOD THEREOF

CROSS-REFERENCE TO RELATED APPLICATION

This Application is a Divisional Application of U.S. application Ser. No. 13/875,418, filed May 2, 2013, which claims the benefit under 35 U.S.C. §119(a) of Korean Patent Application No. 10-2012-0085905 filed on Aug. 6, 2012, in the Korean Intellectual Property Office, the entire disclosures of which are incorporated herein by reference for all purposes.

BACKGROUND

1. Field

The following description relates to a semiconductor device and a fabrication method thereof, and to, for example, a high voltage device or a lateral double diffused metal oxide semiconductor field effect transistor (LDMOS) that is implemented based on a fabrication process of a low voltage device for high performance logic and a fabrication method thereof.

2. Description of Related Art

During the fabrication process of display driver integrated circuits (ICs), nonvolatile memory devices such as flash memories, or audio codec devices having a speaker control logic embedded therein, a low voltage transistor and a high voltage transistor are commonly simultaneously implemented on the same substrate. The high voltage level required for respective semiconductor devices may be at least 10 V to several tens of voltages. On the other hand, the voltage level required for logic devices is being reduced to minimize the sizes of chips and to obtain high performance. Therefore, the difference between the high voltage required for the high voltage transistor components and the low voltage required for the low voltage components is continuing to increase. Thus, and it is difficult to fabricate the integrated circuits while forming two different types of transistors in the same substrate.

Technologies for forming a high voltage device or an LDMOS based on a logic process have been developed. These technologies allow the implementation of high voltage devices without additional processes. High voltage NMOS devices formed in this manner may includes a single gate oxide layer, a gate electrode, and a source/drain junction. The high voltage NMOS devices are fabricated using only processes used in logic processes. However, the performance of the high voltage components of these devices is not optimal.

For example, when a thick gate oxide layer is used in these devices as a gate oxide layer as in the logic processes, a high breakdown voltage (BVDss) characteristic is obtained but the current drivability is lowered and the on-resistance is increased. Further, when a thin gate oxide layer is used, the current drivability is improved, but the high breakdown voltage value is lowered.

SUMMARY

In one general aspect, there is provided a semiconductor device, including: a P type well region and an N type well region formed in a substrate; a gate insulating layer having a non-uniform thickness and formed on the P type well region and the N type well region; a gate electrode formed on the gate insulating layer; a P type well pick-up region formed in the P type well region; and a field relief oxide layer formed in the N type well region between the gate electrode and the drain region.

The gate insulating layer on the P type well region may have areas of two or more different thicknesses.

The gate insulating layer on the N type well region may have a uniform thickness.

The gate insulating layer on the N type well region may have areas of two or more different thicknesses.

The gate insulating layer on the P type well region may have a uniform thickness.

A portion of the gate insulating layer on the N type well region may have a first thickness, and a portion of the gate insulating layer on the P type well region may have a second thickness smaller than the first thickness.

An interface between the portion of the gate insulating layer having the first thickness and the portion of the gate insulating layer having the second thickness may be disposed on the P type well.

An interface between the portion of the gate insulating layer having the first thickness and the portion of the gate insulating layer having the second thickness may be disposed on the N type well.

The general aspect of the semiconductor may further include: a source region formed in the P type well region; and a drain region formed in the N type well region.

The general aspect of the semiconductor may further include a PN junction region at an interface between the P type well region and the N type well region.

An interface between the portion of the gate insulating layer having the first thickness and the portion of the gate insulating layer having the second thickness may be disposed on the PN junction.

The general aspect of the semiconductor may further include a low concentration N type doping region in the P type well region.

The field relief oxide layer may overlap one of spacers formed on sidewalls of the gate electrode and the gate electrode.

The gate insulating layer may include: a first gate insulating layer formed on one portion of the P type well region and the N type well region; and a second gate insulating layer formed on the other portion of the P type well region and having a smaller thickness than the first gate insulating layer.

The P type well region and the N type well region may include a retrograde well.

The gate insulating layer may include a silicon oxynitride layer.

The semiconductor device may include a lateral double diffused metal oxide semiconductor field effect transistor (LDMOS).

In another general aspect, there is provided a method of fabricating a semiconductor device, involving: forming a lateral double diffused metal oxide semiconductor field effect transistor (LDMOS) device in a first region of the semiconductor device; and forming a complementary MOS (CMOS) device in a second region of the semiconductor device, wherein the forming of the LDMOS device includes: forming a field relief oxide layer, an N type well region, and a P type well region; forming a gate insulating layer having different thicknesses on the N type well region and the P type well region; forming an LDMOS gate electrode on the gate insulating layer; forming a source region in the P type well region; and forming a drain region in the N type well region.

The forming of the CMOS device may include: forming a CMOS well region; forming a gate insulating layer on the CMOS well region; forming a CMOS gate electrode on the gate insulating layer; forming a CMOS source region in the CMOS well region; and forming a CMOS drain in the CMOS well region.

The P type well region or the N type well region of the LDMOS device may have the same depth as that of the CMOS well region.

The gate insulating layer on the P type well region may be formed to have the different thicknesses.

The gate insulating layer on the N type well region may be formed to have a uniform thickness.

The forming of the gate insulating layer may include: forming a first gate insulating layer on one portion of the P type well region and the N type well region; and forming a second gate insulating layer on the other portion of the P type well region and having a smaller thickness than the first gate insulating layer.

The general aspect of the method may further involve forming a p type well pick-up region in the P type well region between the source region and a device isolation layer.

The field relief oxide layer may overlap with one of spacers formed on sidewalls of the gate electrode and the gate electrode.

The forming of the gate insulating layer having different thicknesses may include: depositing a first gate insulating layer having a first thickness on the semiconductor substrate; depositing a photoresist layer on the first gate insulating layer; removing a portion of the gate insulating layer to expose a portion of a surface of the semiconductor substrate; and forming a second gate insulating layer having a smaller thickness than the first thickness on the exposed surface of the semiconductor substrate.

The forming of the second gate insulating layer may include forming the second gate insulating layer through a thermal oxidation method or a chemical vapor deposition (CVD) method.

After the forming of the second gate insulating layer, the first gate insulating layer may have a greater thickness than a thickness of the first gate insulating layer initially deposited on the semiconductor substrate.

The thin second gate insulating layer may be formed through the thermal oxidation method, and the forming of the second gate insulating layer may include: removing the photoresist layer on the first gate insulating layer; and simultaneously forming a silicon oxide layer formed on the first gate insulating layer.

The thin second gate insulating layer may be formed through the CVD method, and the forming of the second gate insulating layer may include: removing the photoresist layer on the first gate insulating layer; and simultaneously forming the second gate insulating layer formed on the first gate insulating layer.

In another general aspect, there is provided a method of fabricating a semiconductor device, the method involving: forming an N type well region and a P type well region in a substrate; forming a gate insulating layer having a non-uniform thickness on the N type well region and the P type well region, and forming a gate electrode over the gate insulating layer; forming device isolation layers in the N type well region and the P type well region; forming second doping regions in the N type well region and the P type well region, in which the second doping regions include a well region of a lateral double diffused metal oxide semiconductor field effect transistor (LDMOS) device and a well region of a complementary MOS (CMOS) device.

Other features and aspects may be apparent from the following detailed description, the drawings, and the claims.

Figure 1:
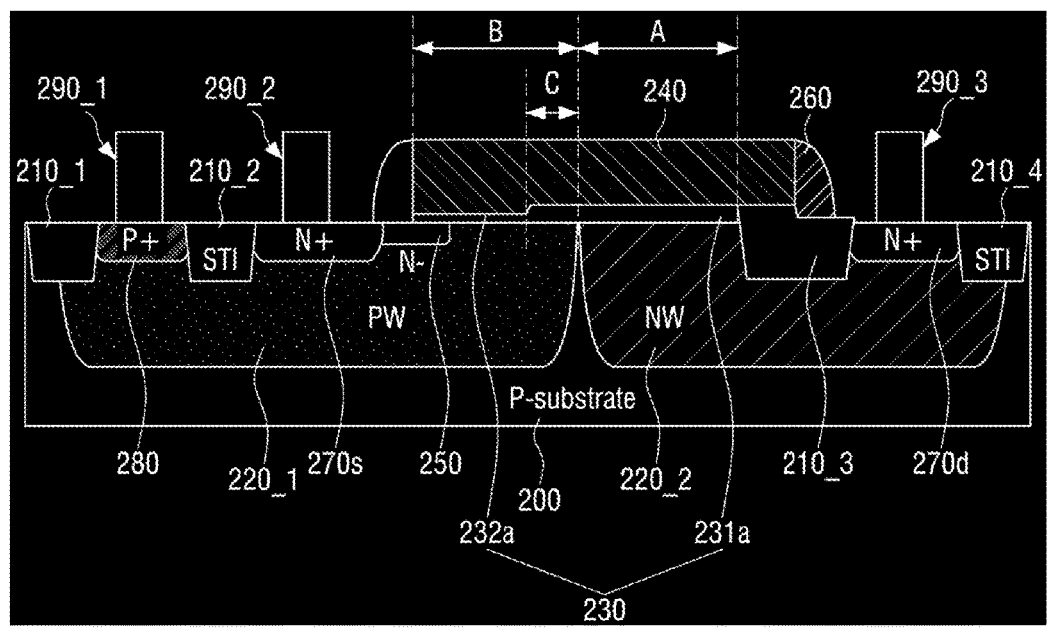
FIG. 1 is a cross-sectional view illustrating an example of a semiconductor device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

The terminologies used herein are selected for the purpose of describing the examples only and are not to be construed in a limiting manner. As used herein, the singular forms "a," "an" and "the" are intended to include the plural forms as well, unless the context clearly indicates otherwise. It will be further understood that the terms "comprises" and/or "comprising," specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected" to or "directly coupled to" another element or layer, there are no intervening elements or layers present. Like numerals refer to like elements throughout. As used herein, the term "and/or" includes any and all combinations of one or more of the associated listed items.

Spatially relative terms, such as "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Also, examples may be described with reference to schematic cross-sectional views or plan views, which are schematic diagrams of idealized examples. As such, variations from the shapes of the illustrations, as a result, for example, of manufacturing techniques and/or tolerances, are to be expected. For example, an etched region illustrated in a right angle may be in the rounded shape or in the shape of having a predetermined curvature. Thus, the below described examples should not be construed as being limited to the particular shapes of regions illustrated herein, but are to include deviations in shapes that result from, e.g., a manufacturing process. Thus, the regions illustrated in the drawings are schematic in nature and are not intended to limit the scope of the claims.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

FIG. 1 is a cross-sectional view illustrating an example of a semiconductor device.

For example, the semiconductor device illustrated in FIG. 1 may be a structure of an LDMOS device fabricated using a process that is used in fabricating a sub-micron CMOS device. FIG. 1 illustrates a process of fabricating the semiconductor device when the CMOS device and the LDMOS device are simultaneously formed on a single semiconductor substrate.

An example of the semiconductor device may include all or a portion of a semiconductor substrate 200, a plurality of device isolation layers 210_1, 210_2, 210_3, 210_4, a P type well region 220_1 and an N type well region 220_2, a gate insulating layer 230, a gate electrode 240, a first doping region 250, gate spacers 260, second doping regions 270s, 270d, a contact junction unit 280, and a plurality of electrodes 290_1, 290_2, 290_3, as illustrated in FIG. 1.

Herein, the expression "including all or a portion thereof" means that the semiconductor device may be constructed while omitting, for example, one or more of the device isolation layers 210_1, 210_2, 210_3, 210_4, the gate spacers 260, or the contact junction unit 280, and further omitting the sub electrode 290-1 in contact with the contact junction unit 280 and the like. For illustrative purposes, an example of a semiconductor device that includes all of the mentioned elements is described below.

In the illustrated example, the semiconductor substrate 200 includes, for instance, a silicon substrate. The silicon substrate may be a wafer, a quartz substrate, or a glass substrate, for example. The semiconductor substrate 200 is divided into a first region for forming a P type well layer and a second region for forming an N type well layer. The first region may be referred to as a P type well region, or a P type well 220_1. The second region for forming an N type well layer may be referred to as an N type well region, or an N type well 220_2.

The plurality of device isolation layers 210_1, 210_2, 210_3, 210_4 are formed along the upper edges of the P type well 220_1 and the N type well 220_2, in between the second doping region 270s and the contact junction unit 280 in the P type well 220_1, and in a portion of the N type well 220_2 in contact with the second doping region 270d. The second device isolation layer 210_2 is formed between the second doping region 270s and the contact junction unit 280 in the semiconductor substrate 200 through a shallow trench isolation (STI) process substantially before the P type well 220_1 and the N type well 220_2 are formed. That is, a process of forming a trench in a surface of the semiconductor substrate 200 and forming an insulating material in the trench may be performed to form the plurality of device isolation layers 210_1, 210_2, 210_3, 210_4. Among the plurality of device isolation layers 210_1, 210_2, 210_3, 210_4, the third device isolation layer 210_3 is formed of an oxide material and relieves an electric field between a gate electrode and a drain electrode. Thus, the third device isolation layer 210_3 may be referred to as a field relief oxide layer.

At this time, the P type well 220_1 in the first region of the semiconductor substrate 200 and the N type well 220_2 in the second region thereof are formed to have constant depths from the surface of the semiconductor substrate 200. For example, the P type well 220_1 may be formed through a P type retrograde well process used in a logic process of a high voltage NMOS device. The N type well 220_2 may be formed in a drain terminal of the high voltage NMOS device using an N type retrograde well process used in the logic process. The retrograde well denotes a well in which an ion implantation depth and a concentration profile are adjusted using the ion implantation energy and dose. On the other hand, a conventional well is a well in which an ion implantation depth and a concentration profile are adjusted through a diffusion process using a high temperature annealing process.

The retrograde well is formed to reduce the off-state leakage current. Therefore, the retrograde well is formed in a channel between the source region and the drain region of the high voltage semiconductor device. For example, in an NMOS device, boron (B) ions are implanted using an ion implantation process. Similarly, in a PMOS device, phosphorus (P) ions are implanted. The ions are implanted with different energy from each other so that the ions are implemented deeply, less deeply, or shallowly, and an amount of the implanted ions may differ according to the energy levels. The boron (B) ions for the NMOS device and the phosphorus (P) ions for the NMOS device may be diffused during the source/drain annealing process so that the boron (B) ions for the NMOS device and the phosphorus (P) ions for the NMOS device have a relatively uniform concentration to a certain depth from the surface of the semiconductor substrate below the gate. In this example, the off-state leakage current refers to a leakage current that occurs between the source region and the drain region when a transistor is turned off. Therefore, the off-state leakage current between the source and drain regions is reduced with the use of the retrograde well. Further, the resistance in a channel region may be constant since the concentration of the well region is uniform to a constant depth. When a high voltage (HD) well region is formed through a drive-in annealing process after the ion implantation, the ion concentration is reduced as the depth from the surface of the semiconductor substrate is increased. When the retrograde well is used, the ion concentration is uniform to a specific depth from the surface of the semiconductor substrate. In one example, the concentration may be uniform from the surface of the semiconductor substrate to a depth of about 0.9 μm to 1.0 μm.

As illustrated in FIG. 1, a PN junction region is formed at an interface between the P type well 220_1 and the N type well 220_2 of the semiconductor substrate 200. The net concentration of dopants in the PN junction region may be lower than the concentration in the respective well due to the recombination of dopants having different conductivities from each other at the interface between the wells.

The gate insulating layer 230 is formed on the semiconductor substrate 200 in the interface between the P type well 220_1 and the N type well 220_2. At this time, the gate insulating layer has a non-uniform thickness. In other words, there are regions of two or more different thicknesses when the entire gate insulating layer is considered in its entirety. For instance, the gate insulating layer is formed to include a first gate insulating layer 231a having a relatively thick thickness on one portion of the P type well 220_1 and the N type well 220_2 and a second gate insulating layer 232a having a relatively thin thickness on the other portion of the P type well 220_1. Although the example illustrates that the thin second gate insulating layer 232a constituting the gate insulating layer 230 is formed to be distant from the interface between the P type well 220_1 and the N type well 220_2, the semiconductor device is not limited thereto. In other examples, the thin second gate insulating layer 232a may be formed on the entire P type well 220_1. Alternatively, the gate insulating layer 230 may be formed so that the thickness thereof is variously controlled according to characteristic of the semiconductor device. Since the thickness of the gate insulating layer 230 is controlled according to high voltage characteristics, the thickness of the thin second gate insulating layer 232a may be also controlled.

An example of a method of forming a gate insulating layer 230 will be described below. For example, a thick gate oxide layer may be deposited on the semiconductor substrate 200. A photoresist (PR) layer may be formed through a photolithography process for a dual oxide layer process so that a portion of the thick gate oxide layer in the drain terminal side of the semiconductor device is covered by the photoresist layer and the photoresist layer on a portion of the thick gate oxide layer 230 in a source terminal side thereof is removed. The gate oxide layer in the source side exposed through the photolithography process is removed. As the method of removing the oxide layer, any one of a wet etching process and a dry etch process may be used. Then, a thin gate oxide layer is deposited on the exposed P type well 220_1 of the semiconductor substrate 200 again to form the gate insulating layer 230 including the first and second insulating layers 231a, 232a. After the above-described process, the gate insulating layer 230 has a non-uniform thickness.

In FIG. 1, the label A denotes a distance from a well for a drain to the third device isolation layer 210_3, which is the STI device isolation layer. The label B denotes a channel length. The label C denotes a length of an overlapping region between the thick gate insulating layer and the P type well 220_1.

In the above-described process, the length C of the overlapping region between the photoresist layer for a dual oxide layer and the P type well 220_1 may be controlled according to the characteristics of the semiconductor devices desired by a designer. For example, assuming that the stable high voltage characteristic is ensured when C>0, it is advantageous to ensure high current characteristic when C=0. When the thin second gate insulating layer 232a is formed onto the N type well through the P type well, the high high-current characteristic is ensured, but it is difficult to ensure the high breakdown voltage due to increase in an electric field between the gate and the N type well. Therefore, the thin second gate insulating layer 232a may be formed so that the second insulating layer 232a may not pass through the interface between the P type well and the N type well.

Further, the gate insulating layer 230 may not be formed so that the first gate insulating layer 231a and the second gate insulating layer 232a are separated. For example, the gate oxide layer 230 may be formed by depositing thick gate oxide layer and partially removing a portion of the thick gate oxide layer in the source terminal externally exposed through a photolithography process and an etching process. Therefore, the gate insulating layer is not limited thereto and any structure of gate insulating layers having a non-uniform thickness may be applied in other examples. For example, the gate insulating layer may have a non-uniform thickness by forming an embossing structure.

A thermal oxide layer is mainly used as a material for the gate insulating layer 230. Among the thermal oxide layers, a native silicon oxide ($SiO_2$) layer may be used to reduce a signal to noise (S/N) ratio. This is because the native silicon oxide ($SiO_2$) layer has a better S/N ratio than a silicon oxynitride (SiON) layer. Further, the silicon oxynitride (SiON) layer may be used to improve the reliability of the gate insulating layer 230. The silicon oxinitride (SiON) layer may be formed by annealing a thermal oxide layer at a high temperature in an ambient NO gas. When a SiON gate insulating layer is used, the penetration of boron from the gate electrode into the semiconductor substrate is prevented; thus, the reliability of the device may be improved in comparison to a device that uses a native thermal oxide layer. The SiON gate insulating layer also exhibit excellent gate oxide integrity (GOI) and negative bias temperature instability (NBTI) in comparison to a gate insulating layer formed with a native thermal oxide layer. Nitrogen is mainly distributed at an interface between a silicon substrate and the gate oxide ($SiO_2$) layer by an NO gas annealing process.

Referring to FIG. 1, the gate electrode 240 may be formed on the gate insulating layer 230. For example, a polysilicon layer is deposited on the gate insulating layer 230, and the gate electrode 240 is formed through a photolithography process and an etching process.

The first doping region 250 is formed in the P type well 220_1 below the gate insulating layer 230, and one of the gate spacers 260 may be formed in contact with the gate insulating layer 230. The first doping region 250 is a low concentration N type ($N^-$) doping region. The first doping region 250 is formed by performing an N type junction process for an N type low concentration doping region, and is referred to as $N^-$ lightly doped drain ($N^-$LDD) of the logic device. The $N^-$LDD region is not formed in the drain terminal, but only in the source terminal. Therefore, an electric field between the gate electrode and the source terminal may be reduced. The $N^-$LDD region is omitted in the drain terminal since the STI device isolation layer has been previously formed in the drain terminal.

The gate spacers 260 are formed on the sidewalls of the gate electrode 240. The gate spacers 260 may have a stacking structure of an oxide layer and a nitride layer.

The second doping regions 270s, 270d are formed in the P type well 220_1 and the N type well, respectively. The second doping regions 270s, 270d are formed through N type high concentration doping and diffusion. The second doping region 270s in the P type well 220_1 is formed between the second device isolation layer 210_2 and the first doping region 250. The second doping region 270d in the N type well 220_2 is formed between the third device isolation layer 210_3 and the fourth device isolation layer 210-4.

The second device isolation layer 210_2 is disposed between the contact junction unit 280 and the second doping region 270s, and is required for bias separation. This is because different voltages are applied to the second doping region 270s having an N type high concentration (N$^+$) and to the contact junction unit 280 having P type high concentration (P$^+$), respectively. When the N$^+$ type second doping region 270s is in contact with the P$^+$ type contact junction unit 280, different voltages cannot be applied to the N$^+$ type second doping region 270s and the P$^+$ type contact unit 280; thus, the same voltage is applied thereto. On the other hand, when the semiconductor device is used by applying the same voltage to the N$^+$ type second doping region 270s and the P$^+$ type contact unit 280, the second device isolation layer 210_2 may be removed, and the N$^+$ type second doping region 270s and the P$^+$ type contact unit 280 may be formed to be in contact with each other.

The third device isolation layer 210_3 that functions as the field relief oxide layer causes an electric field between the gate and drain to be reduced. When the third device isolation layer 210_3 is removed and the second doping region 270d is disposed in the sidewall of the gate electrode, a distance between the gate and the N$^+$ type second doping region 270s is reduced. When high voltages are applied to the N$^+$ type second doping region 270s and the P$^+$ type contact unit, respectively, a high electric field is formed, and the gate oxide layer adjacent to the N$^+$ type second doping region 270s may rupture. When the gate oxide layer ruptures, a significant leakage current may flow between the gate and the N type well, and the device may malfunction. The third device isolation layer 210_3 may be fabricated through a local oxidation of silicon (LOCOS) process or a STI process. However, in this example, the third device isolation layer 210_3 is formed through the STI process. The STI method may easily control the depth of an oxide layer for the device isolation layer and form the oxide layer that haves a larger depth than an oxide layer formed by the LOCOS process. The STI oxide layer may have a higher breakdown voltage than the LOCOS oxide layer. For example, the depth of the STI oxide layer may be in a range of about 2000 Å to about 4000 Å. The field relief oxide 210_3 overlaps the gate spacer and the gate electrode.

The contact junction unit 280 is formed in an edge of the P type well 220_1 between the device isolation layers 210_1 and 210_2. The contact junction unit 280 is formed through a high concentration P type (P$^+$) doping process. The contact junction unit 280 is formed to form a contact with the P type semiconductor substrate 200. Further, the contact junction unit 280 is used to cause the P type well to be grounded, or to cause a back bias to be applied to the P type well. Thus, the contact junction unit 280 is referred to as a well pick-up region.

After an interlayer dielectric layer is formed, the plurality of electrodes 290_1, 290_2, 290_3 are formed on the second doping regions 270s, 270d and the contact junction unit 280. For example, the plurality of electrodes 290_1, 290_2, 290_3 include a sub electrode 290_1 formed on the contact junction unit 280, a source electrode 290_2 formed on the second doping region 270s in the P type well 220_1, and a drain electrode 290_3 formed on the second doping region 270d in the N type well 220_2. The plurality of electrodes 290_1, 290_2, 290_3 may be formed using the same material through the same process.

From the above-described configuration, the high voltage characteristics and the high current characteristics that are not simultaneously obtained are simultaneously ensured, and a size of the high voltage device using the high voltage characteristic becomes smaller so that the fabrication cost is further reduced.

Since a modification to a high voltage circuit or to a low voltage circuit may be performed according to a purpose of the design only using a dual gate oxide layer process pattern in the same design, the application range of a high voltage circuit using the above-described process is wide, reducing the cost for designing a specific device and reducing the time required for the fabrication. For example, high voltage circuit blocks having different desired electrical characteristics may be designed into a single layout, and the single layout may be used by modifying only the layout for the dual oxide layer photolithography process to produce a specific device. Thus, the application range of the high voltage circuit becomes wider.

Figure 2:
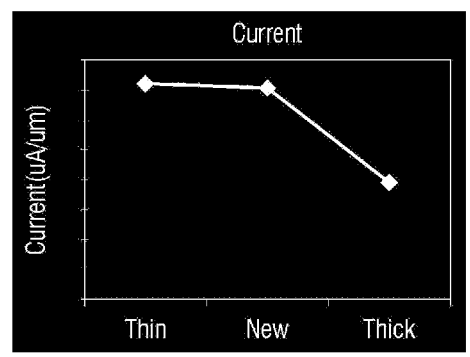
FIG. 2 is a graph showing current characteristics of the semiconductor device of FIG. 1.
Figure 3:
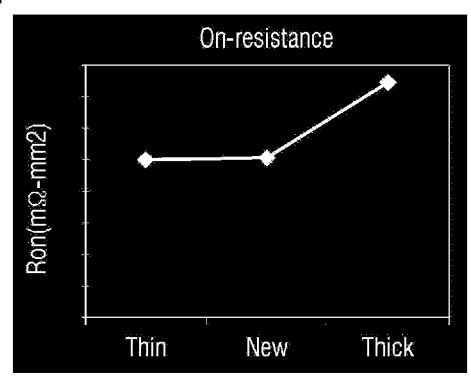
FIG. 3 is a graph showing on-resistance characteristics of the semiconductor device of FIG. 1.
Figure 4:
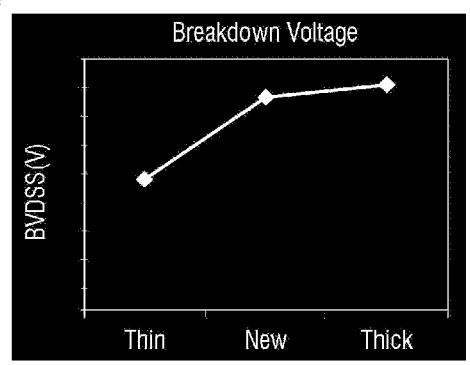
FIG. 4 is a graph showing a breakdown voltage characteristic of the semiconductor device of FIG. 1.

FIG. 2 is a graph showing the current characteristics of the semiconductor device illustrated in FIG. 1. FIG. 3 is a graph showing the on-resistance characteristics of the semiconductor device illustrated in FIG. 1. FIG. 4 is a graph showing the breakdown voltage characteristics of the semiconductor device illustrated in FIG. 1.

Referring to FIGS. 2 to 4, when the semiconductor device in the related art includes a thick gate insulating layer, high breakdown voltage (BVDss) characteristics are ensured but the on-resistance value increases due to a decrease in the current drivability. On the other, in semiconductor devices that include a thin gate insulating layer, while a superior current drivability may be obtained, the breakdown voltage characteristics may deteriorate.

However, in the illustrated example, it can be seen from FIG. 1 that when the gate insulating layer of the semiconductor device having a structure of C=0 (zero) μm is formed to have a non-uniform thickness, both the superior current drivability and the high breakdown voltage characteristic can be simultaneously obtained.

In the examples described above, as the gate oxide layer on the N type drift well 220_2 serving as the drain terminal of the semiconductor device becomes thicker, the breakdown voltage of the semiconductor device is increased. On the other hand, as the gate oxide layer on the P type well 220_1 serving as the substantial channel becomes thin, the current drivability characteristic is improved. This means that the breakdown voltage and the current drivability may be controlled by adjusting the on-resistance value through controlling the thickness of the gate oxide layer.

Therefore, the high voltage device is formed through a dual oxide layer formation process used in the logic process so that the drain terminal of the high voltage device has the thick oxide layer and a portion of the source terminal thereof has the thin oxide layer so that both the high voltage characteristic and the high current characteristic are ensured.

FIGS. 5 to 8 are views illustrating an example of a process of fabricating the semiconductor device of FIG. 1. That is, FIGS. 5 to 8 illustrate an example of a method of fabricating a semiconductor device when a CMOS device and an LDMOS device are simultaneously formed on a surface of the same semiconductor substrate. Since most process steps are simultaneously performed and the same process condition is used with respect to the CMOS device and the LDMOS device, the number of total process steps and total fabrication cost are reduced.

For brevity, FIGS. 5 to 8 illustrate only a process of forming an LDMOS device. Although a process of forming a CMOS device is not illustrated, the process of fabricating the CMOS device is substantially simultaneously performed when the process of fabricating the LDMOS device illustrated in FIGS. 5 to 8 are performed.

Figure 5:
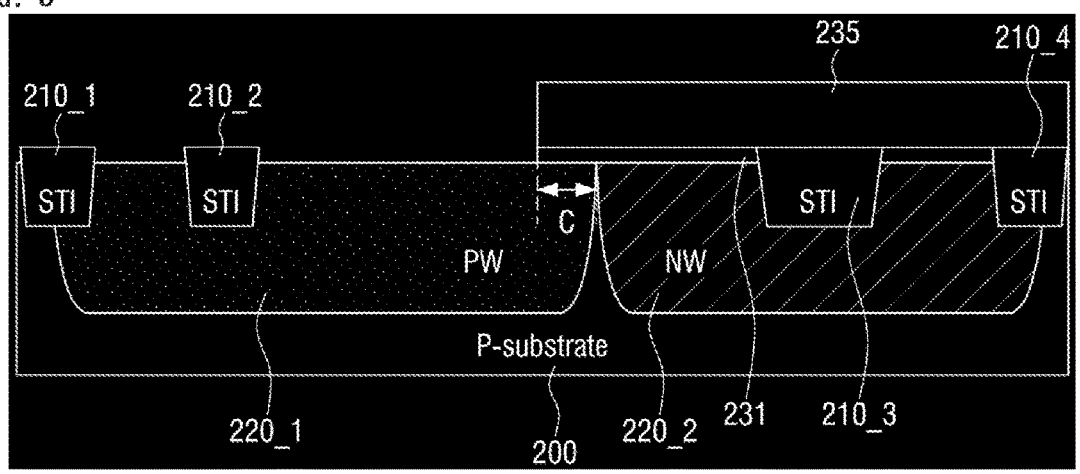
FIGS. 5 to 8 are cross-sectional views of a semiconductor device illustrating an example of a method of fabricating the semiconductor device of FIG. 1.
Figure 6:
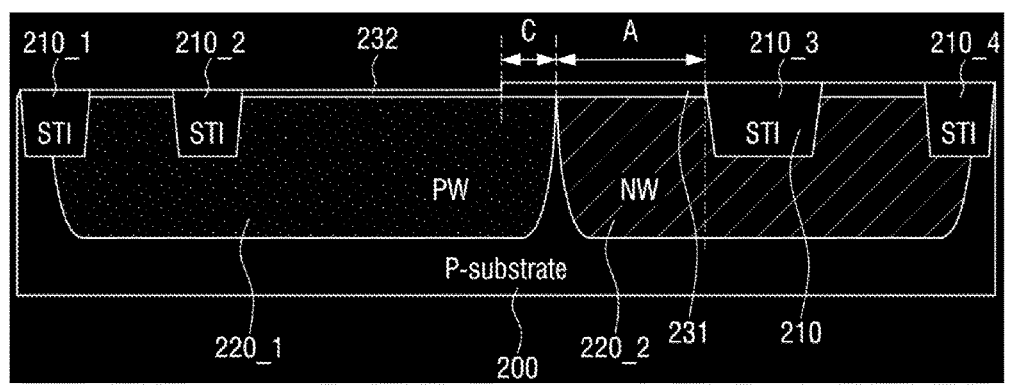

Referring to FIG. 5, to form the LDMOS device on a P type or N type semiconductor substrate 200, a plurality of device isolation layers 210_1, 210_2, 210_3, 210_4 are formed and a P type well 220_1 and an N type well 220_2 are formed. In this example, the forming of the P type well 220_1 and the N type well 220_2 is performed in the same process step as the process step of forming a P type well and an N type well for the CMOS device under the same process condition. Thus, a high voltage well that is generally formed through a drive-in annealing process for the LDMOS device at a high temperature of above 1000° C., is not used. Rather, the retrograde P type well and N type well used in the CMOS device process are used in this example. Therefore, when the LDMOS device and the CMOS device are simultaneously formed, the P type well of the LDMOS device substantially has the same depth as that of the P type well of the CMOS device. Similarly, the N type well of the LDMOS device substantially has the same depth as that of the N type well of the CMOS device. As described above, the P type well and the N type well of the LDMOS device include retrograde wells.

In this example, the plurality of device isolation layers 210_1, 210_2, 210_3, 210_4 may be formed by forming trenches in the semiconductor substrate 200 and burying an insulating material in the trenches. The insulating material may be deposited on the semiconductor substrate 200 in which the trenches are formed and patterned through a photolithography process and an etch process to form the plurality of device isolation layers 210_1, 210_2, 210_3, 210_4 buried in the trenches. The P type well 220_1 may be formed by implanting P type ions into the semiconductor substrate 200, and the N type well 220_2 may be formed by implanting N type ions into the semiconductor substrate 200.

Subsequently, a first gate insulating layer 231, for example, a thick oxide layer is deposited and a photoresist (PR) layer 235 is deposited on the first gate insulating layer 231. A photolithography process for a dual gate oxide layer process is performed so that the photoresist layer 235 covers the drain terminal side of the LDMOS device and a portion of the photoresist layer 235 in the source terminal side is removed through an exposure and development process. Next, the exposed first gate insulating layer 231 formed of the thick oxide layer in the source terminal side is removed through a wet etching process or a dry etching process. Accordingly, the thick first gate insulating layer 231 remains only on the N type well 220_2 and a portion of the P type well 220_1. In this process, the length C of the overlapping region between the photoresist layer 235 and the P type well 220_1 may be controlled by performing the process according to the device characteristics. The high voltage characteristic is advantageously ensured when C>0 and vice versa, the high current characteristic is advantageously ensured.

Subsequently, a second gate oxide layer 232, for example, a thin oxide layer is formed on an exposed semiconductor substrate 200 on the P type well 220-1. The second gate insulating layer 232 may be formed thinner than the first gate insulating layer 231 to ensure the high breakdown voltage characteristic of the LDMOS device. The second gate insulating layer 232 may be formed through a thermal oxidation method or a chemical vapor deposition (CVD) method. Thus, the gate insulating layer 231 may be larger than a thickness thereof as initially deposited. This is because when the thin second gate insulating layer 232 is formed through the thermal oxidation method, the second gate insulating layer 232 formed of the silicon oxide layer is also formed on the substrate surface on which the first gate insulating layer 231 is formed. Further, when the thin second gate insulating layer 232 is formed through the CVD method, the second gate insulating layer 232 is also formed on the first gate insulating layer 231.

Subsequently, the photoresist layer 235 remaining on the first gate insulating layer 231 is removed. Finally, the first and second insulating layers are formed so that the thickness of the first gate oxide layer 231 is different from that of the second gate oxide layer 232.

Similarly, when the dual oxide layer in the LDMOS device is formed, a dual oxide layer of the CMOS device may be formed through the same method under the same condition. Therefore, the dual oxide layer is also formed in the CMOS device, and the portions of the dual gate oxide layer on the P type well and the N type well in the LDMOS device are substantially the same as those in the CMOS device. In this example, in an CMOS device, the dual oxide layer is formed on the CMOS well region. In addition, a P type well is used in the NMOS of the CMOS device, and gate insulating layers having different thicknesses according to the operation voltages of the devices are formed in the P type well. For example, when the NMOS devices have the operation voltages of 1.5V and 5.5 V, respectively, the gate insulating layers are formed to have different thicknesses in the CMOS P well. At this time, the gate insulating layers are formed to be separated from each other. This is because different operation voltages are applied to the NMOS devices including the gate insulating layers having the different thicknesses.

As described above, both the thin gate insulating layer and the thick gate insulating layer are formed on the P type well 220_1 to ensure the high voltage characteristic. Alternatively, the thin second gate insulating layer 232 may be formed from on the P-type well 220_1 onto the N type well 220_2 to ensure the high current characteristic. Thus, both the thin gate insulating layer 232 and the thick first gate insulating layer 231 are formed on the N type well 220_2 together. This is because, although not illustrated in FIG. 6, the gate insulating layers having the different thicknesses are formed on the N type well through the above-described method. In other words, the thick first gate insulating layer 231 and a photoresist layer are sequentially formed on the P type well 220_1 and the N type well 220_2, and a portion of the first gate insulating layer 231, which is formed on the other portion of the N type well and the P type well other than one portion of the N type well, is removed through an exposure and development process. That is, the thick first gate insulating layer 231, which is formed from on the P type well 220_1 onto the portion of the N type well 220_2, is removed. Therefore, the first gate insulating layer 231 remains only on the one portion of the N type well 220_2. The photoresist layer is removed, and the thin second gate insulating layer 232 for a low voltage is formed on the exposed P type well and the other portion of the N type well. Finally, the first gate insulating layer 231 and the second gate insulating layer 232 having the different thicknesses from each other may be formed. Therefore, the thick first gate insulating layer 231 and the thin second insulating layer 232 are formed on the N type well 220_2 together. Although not separately illustrated, to ensure the high voltage characteristic and the high current voltage characteristic, the thick first gate insulating layer 231 and the thin second gate insulating layer 232 are formed to be in contact with each other in an interface between the P type well 220_1 and the N type well 220_2 or in an PN junction region. That is, this is in the case of C=0 in FIG. 7. The first gate insulating layer 231 is formed on the N type well 220_2 and the second gate insulating layer 232 is formed on the P type well 220-1. The interface between the first gate insulating layer 231 and the second gate insulating layer 232 may correspond to the interface between the P type well and the N type well. The interface between the P type well and N type well is a point in which P type dopants and N type dopant are met. Thus, the interface between the P type well and the N type well is a region in which the PN junction is formed. The interface between the first gate insulating layer 231 and the second gate insulating layer 232 may be formed in the region.

Figure 7:
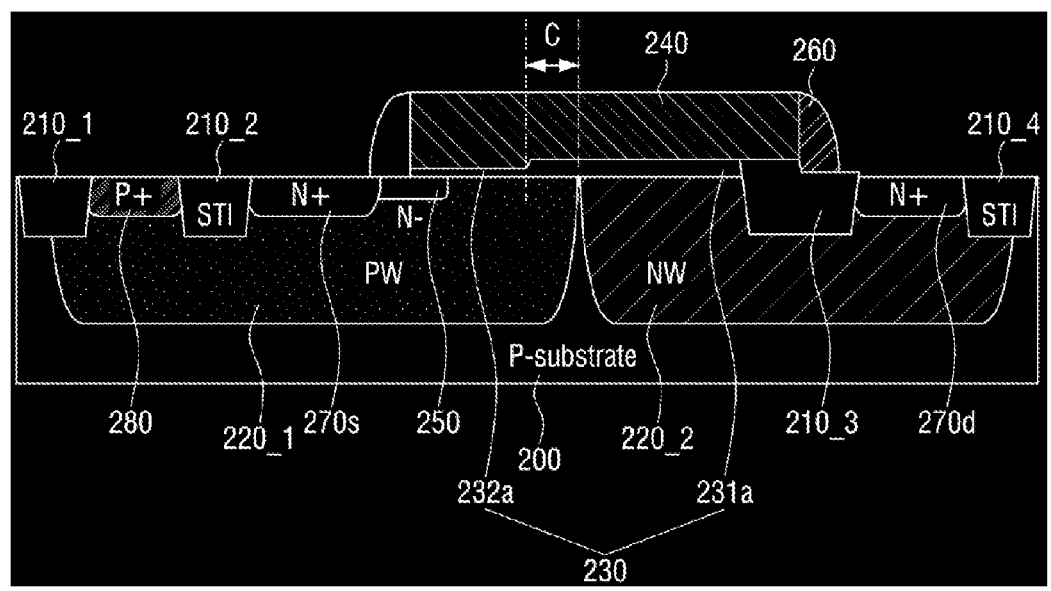

Referring to FIG. 7, for example, gate polysilicon is deposited on the semiconductor substrate 200 on which the gate insulating layer 230 is formed. Then, the gate polysilicon is patterned through a photolithography process to form a gate electrode 240. In this example, the gate electrode 240 is a gate electrode of a LDMOS device, and the gate electrode 240 has an overlapping structure with the field relief oxide layer, for example, the device isolation layer 210-3. Subsequently, a first doping region 250 is formed. As described above, the first doping region 250 is formed only in a portion of the semiconductor substrate in which a source region of the LDMOS device is to be formed. The first doping region 250 may include a low concentration N type doping region (N⁻LDD).

Next, gate spacers 260, second doping regions 270s, 270d, and a contact junction unit 280 are formed. The gate spacers 260 are an LDMOS gate spacer and have a structure of an oxide layer/a nitride layer or an oxide layer/a nitride layer/an oxide layer. One of the gate spacers 260 is in contact with the field relief oxide layer 210_3.

The second doping regions 270s, 270d and the contact junction unit 280 are formed at both sides of the gate electrode 240. The second doping regions 270s, 270d include a high concentration N type (N⁺) doping region. The contact junction unit 280 includes a high concentration P type (P⁺) doping region. At this time, the contact junction unit 280 is formed to form a contact with the P type semiconductor substrate 200.

Even in the CMOS device, a CMOS gate, CMOS gate spacers, a CMOS low concentration N type doping region (N⁻LDD), a CMOS high concentration source region, and a CMOS high concentration drain region are simultaneously formed through the same process as that for formation of the LDMOS device as illustrated in FIG. 7 under the same process condition. There is a difference between the process for the LDMOS device and the process for the CMOS device in that a field relief oxide layer which is formed to overlap the CMOS gate electrode and the CMOS spacers is not formed in the CMOS device. This is different from the LDMOS device.

Figure 8:
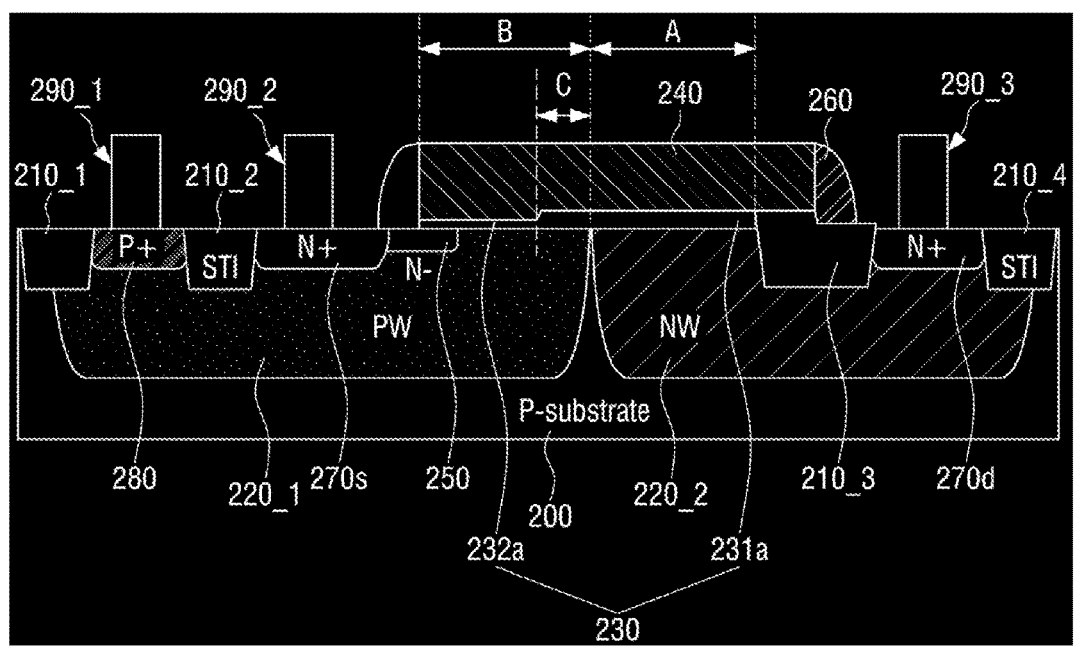

As illustrated in FIG. 8, a plurality of electrodes 290_1, 290_2, 290_3 are formed on the second doping regions 270s, 270d and the contact junction unit 280. For example, the sub electrode 290_1 may be formed on the contact junction unit 280; a source electrode 290_2 may be formed on the second doping region 270s in the P type well 220_1; and the drain electrode 290_3 may be formed on the second doping region 270d in the N type well 220_2. At this time, the sub electrode 290_1 serves to improve electrical characteristics such as relief of an electric field or reduction in a capacitance value.

The plurality of electrodes 290_1, 290_2, 290_3 may be simultaneously formed using the same metal material through the same process. Alternatively, the plurality of electrodes 290_1, 290_2, 290_3 may be formed in various methods. For example, the source and drain electrodes 290_2 and 290_3 may be simultaneously formed, and the sub electrode 290_1 is formed separately from the source and drain electrodes 290_2, 290_3 through a separate process. However, the method of forming the plurality of electrodes 290_1, 290_2, 290_3 is not limited to the above-described examples. The first and second examples have illustrated that the gate insulating layer is formed to have different thicknesses in the P type well 220_1. However, the gate insulating layer thickness is not limited to the examples described above. For example, the gate insulating layer may have different thicknesses in any one of the P type well 220_1 and the N type well 220_2. In the alternative, the gate insulating layer may have different thicknesses on the basis of the interface between the P type well and the N type well.

The foregoing examples were provided for illustrative purposes. Although only a few examples have been described in detail, those skilled in the art will readily appreciate that many modifications are possible to the examples without materially departing from the novel teachings and advantages. Accordingly, all such modifications are intended to be included within the scope of the present description as defined in the claims.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device, comprising:
   a lateral double diffused metal oxide semiconductor field effect transistor (LDMOS) device formed in a first region of the semiconductor device; and
   a complementary MOS (CMOS) device formed in a second region of the semiconductor device,
   wherein the LDMOS device comprises:
   a P type well region and an N type well region formed in a substrate;
   a gate insulating layer having a non-uniform thickness and formed on the P type well region and the N type well region;
   a gate electrode formed on the gate insulating layer;
   a P type well pick-up region formed in the P type well region;
   a drain region formed in the N type well region; and
   a field relief oxide layer formed in the N type well region between the gate electrode and the drain region,
   wherein the P type well region of the LDMOS device and a P type well region of the CMOS device have substantially the same depth, and the N type well region of the LDMOS device and an N type well region of the CMOS device have substantially the same depth.

2. The semiconductor device of claim 1, wherein the gate insulating layer on the P type well region has areas of two or more different thicknesses.

3. The semiconductor device of claim 1, wherein the gate insulating layer comprises a thin gate insulating layer and a thick gate insulating layer.

4. The semiconductor device of claim 3, further comprising:
   a source region formed in the P type well region,
   wherein the thin gate insulating layer, the thick gate insulating layer, and the field relief oxide layer are formed between the source region and the drain region.

5. The semiconductor device of claim 4, wherein the P type well pick-up region is spaced apart from the source region by a device isolation layer.

6. The semiconductor device of claim 3, further comprising a PN junction region at an interface between the P type well region and the N type well region,
  wherein a distance between an interface of the thin gate insulating layer and the thick gate insulating layer and the PN junction region is less than a distance from the PN junction region to the field relief oxide layer.

7. The semiconductor device of claim 6, wherein:
  the thick gate insulating layer is formed on one portion of the P type well region and the N type well region; and
  the thin gate insulating layer is formed on the other portion of the P type well region.

8. The semiconductor device of claim 3, further comprising a PN junction region at an interface between the P type well region and the N type well region,
  wherein a distance between an interface of the thin gate insulating layer and the gate insulating layer and the PN junction is less than an overlapping distance between the P type well and the thin gate insulating layer.

9. The semiconductor device of claim 1, further comprising a low concentration N type doping region in the P type well region.

10. The semiconductor device of claim 1, wherein the field relief oxide layer overlaps the gate electrode.

11. The semiconductor device of claim 1, wherein the P type well region and the N type well region include a retrograde well.

12. The semiconductor device of claim 1, wherein the gate insulating layer comprises a silicon oxynitride layer.

13. The semiconductor device of claim 1, wherein the CMOS device comprises:
  a CMOS well region;
  a gate insulating layer formed on the CMOS well region;
  a CMOS gate electrode formed on the gate insulating layer;
  a CMOS source region formed in the CMOS well region; and
  a CMOS drain formed in the CMOS well region.

14. A lateral double diffused metal oxide semiconductor field effect transistor (LDMOS) device, comprising:
  a P type well region and an N type well region thereby forming a PN junction region in a substrate;
  a source region formed in the P type well region;
  a drain region formed in the N type well region;
  a thin gate insulating layer, a thick gate insulating layer, and a relief oxide layer formed between the source region and the drain region;
  a gate electrode formed on the thin gate insulating layer, the thick gate insulating layer, and the relief oxide layer; and,
  a P type well pick-up region formed in the P type well region,
  wherein the gate electrode is in direct contact with the thin gate insulating layer, the thick gate insulating layer, and the relief oxide layer; and,
  wherein a top surface of the thick gate insulating layer is coplanar with a top surface of the relief oxide layer.

15. The semiconductor device of claim 14, wherein:
  the thick gate insulating layer is formed on a first portion of the P type well region and the N type well region; and
  the thin gate insulating layer is formed on a second portion of the P type well region.

16. The semiconductor device of claim 14, wherein a distance between an interface of the thin gate insulating layer and the thick gate insulating layer and the PN injunction region is less than a distance from the PN junction region to the field relief oxide layer.

17. The semiconductor device of claim 14, wherein a distance between an interface of the thin gate insulating layer and the thick gate insulating layer and the PN injunction region is less than an overlapping distance between the P type well and the thin gate insulating layer.

18. The semiconductor device of claim 14, wherein the field relief oxide layer has a greater thickness than the thick gate insulating layer.

* * * * *